US005534663A

United States Patent [19]
Rivers et al.

[11] Patent Number: 5,534,663
[45] Date of Patent: Jul. 9, 1996

[54] ELECTRICALLY SHIELDED ENCLOSURE WITH MAGNETICALLY RETAINED REMOVABLE COVER

[75] Inventors: Craig J. Rivers, Livermore; Roanne A. Lee, San Francisco; Glenn E. Jones, Livermore, all of Calif.

[73] Assignee: The United States of America as represented by the United States Department of Energy, Washington, D.C.

[21] Appl. No.: 340,303

[22] Filed: Nov. 14, 1994

[51] Int. Cl.⁶ .................................................. H05K 9/00
[52] U.S. Cl. ................................. 174/35 GC; 220/230; 361/818
[58] Field of Search ........................... 220/230, 240; 174/35 R, 35 C, 35 GC, 35 MS; 361/816, 818

[56] References Cited

U.S. PATENT DOCUMENTS

| | | | |
|---|---|---|---|
| 2,565,891 | 8/1951 | Sherman | 292/251.5 |
| 3,260,788 | 7/1966 | Stetson | 174/356 C |
| 3,364,298 | 1/1968 | Peters | 174/35 MS |
| 3,468,576 | 9/1969 | Beyer et al. | 292/251.5 |
| 3,961,721 | 6/1976 | Gordon et al. | 220/230 |
| 4,110,552 | 8/1978 | Lombardi | 174/35 MS |
| 5,135,012 | 8/1992 | Kamen et al. | 132/294 |
| 5,142,101 | 8/1992 | Matsuzaki et al. | 174/356 C |

*Primary Examiner*—Kristine L. Kincaid
*Assistant Examiner*—Christopher Horgan
*Attorney, Agent, or Firm*—Robert M. Padilla; William C. Daubenspeck; William R. Moser

[57] ABSTRACT

Disclosed is an electrically shielded enclosure having electrical components therein and a removable electrically shielded cover over an opening in the enclosure with a magnetic securement mechanism provided to removably secure the cover to the enclosure in a manner which will provide easy access, yet also provide an electrical seal between the cover and the enclosure capable of preventing the passage of electrical radiation through the joint between the cover and the enclosure. Magnets are provided on the enclosure peripherally around the opening and facing the cover, and a ferromagnetic surface is provided on the mating surface of the cover facing the magnets, with a continuous electrical seal provided between the magnets and the ferromagnetic surface on the cover to prevent the leakage of electromagnetic radiation therethrough. In one embodiment the electrical seal includes a flexible metal casing or surface, which is attached to the enclosure and positioned between the magnets and the ferromagnetic surface on the cover, and which is sufficiently flexible to be capable of conforming to the ferromagnetic surface to provide an electrical seal between the cover and the enclosure. In another embodiment, the electrical seal includes a metal mesh associated with the enclosure and positioned between the magnets on the enclosure and the ferromagnetic surface on the cover. The metal mesh is also capable of conforming to the surface of the ferromagnetic surface to thereby provide an electrical seal between the cover and the enclosure.

4 Claims, 2 Drawing Sheets

ELECTRICALLY SHIELDED ENCLOSURE WITH MAGNETICALLY RETAINED REMOVABLE COVER

BACKGROUND OF THE INVENTION

The invention described herein arose in the course of, or under, Contract No.W-7405-ENG48 between the United States Department of Energy and the University of California for the operation of the Lawrence Livermore National Laboratory.

This invention relates to magnetically retained electrical shielding. More particularly, this invention relates to the provision of magnetically retained shielding for an opening to an electrically shielded enclosure containing electronic components, to prevent the passage of electric fields into or out of the enclosure through the opening.

Many electronic structures are housed in electrically shielded cases or enclosures which are constructed of electrically conductive material, such as metal, to provide electrical shielding either to prevent escape of electromagnetic radiation generated by the electronics within the enclosure or to prevent the incursion of stray electromagnetic fields from external sources. Typical of such electronic structures, for example, are computers and the electronics for the generation of laser beams.

A problem, however, arises when rapid and frequent ingress to the interior of the shielded enclosure is required. While a removable cover can be provided, attempts to make such cover easily removable, yet at the same time, provide the requisite shielding, particularly at the joint between the enclosure and the cover, have met with less than satisfactory results.

If, for example, a shielded cover, i.e., a cover constructed of electrically conductive material, is secured to the enclosure by a plurality of fasteners such as bolts, to thereby provide a fit between the cover and enclosure through which undesired leakage of electromagnetic radiation cannot pass, removal of the cover will be slow and cumbersome, which can result in the temptation by operators to omit the use of some of the fasteners. This, in turn, will defeat the leakproof design of the electrical seal, thereby allowing some electromagnetic radiation to pass through the joint between the cover and enclosure either into or out of the enclosure. Even when such a clamping type structure is modified by proving electrically conductive elastomeric materials between the cover and the enclosure, to reduce the number of required fasteners by providing some degree of relief for non-perfectly matching surfaces between the cover and enclosure, it has been found that when such elastomeric materials contained sufficient conductive fillers to provide the requisite electrical sealing or shielding, the durability of the material is reduced to an unsatisfactory level.

The provision of latches to provide rapid removal of the cover and ingress to the interior of the enclosure has also been proposed. However, in some instances, the provision of latches adds unacceptable bulk to the structure, particularly when space is at a premium, for example, when high voltage components are used requiring large air gaps for high voltage standoff in the enclosure.

The use of metallized Velcro on the mating surfaces of the enclosure and removable cover has also been proposed and tried. However, the portions of the Velcro secured to horizontal surfaces are susceptible to collecting dust, lint and other particulate matter. Furthermore, air gaps in the Velcro permit electrical leaks, i.e., result in leakage of electromagnetic radiation through the joint. Furthermore, when high voltage is used in the enclosure, e.g., in electronics used for the generation of a laser beam, such leakage can, in turn, cause arcing and vaporizing of the metallized portions of the Velcro, leading to further degradation of the quality of the electrical seal between the enclosure and the cover.

Metal to metal friction type sealing between the cover and enclosure has also been proposed and tried wherein a tapered surface on either the cover or the enclosure was squeezed into a channel like structure on the other member. However, the frictional forces required to make such a seal sufficient to prevent the undesired electrical leakage, in turn makes subsequent removal of the cover difficult due to the high frictional forces induced by design into such a structure.

It would, therefore, be desirable to provide a structure comprising an electrically shielded enclosure containing electrical components, and a shielded cover, wherein the cover could be secured to the enclosure in a manner which would permit ready access to the interior of the enclosure, yet provide an electrical seal therebetween capable of preventing the leakage of electromagnetic radiation either into or out of the enclosure when the cover is secured to the enclosure.

SUMMARY OF THE INVENTION

The invention comprises an electrically shielded enclosure having electrical components therein and an easily removable shielded cover with magnetic securement means provided to secure the cover to the enclosure in a manner which will provide an electrical seal between the cover and the enclosure to prevent the passage of electromagnetic radiation through the joint between the cover and the enclosure. The magnetic securement means are provided on the surface of the enclosure surrounding the opening and facing the cover, and ferromagnetic means are provided on the surface of the cover facing the magnetic means, with electrical sealing means provided between the magnetic securement means on the enclosure and the ferromagnetic means on the cover to prevent the leakage of electromagnetic radiation therethrough.

In one embodiment the electrical sealing means comprise a flexible metal casing, which is attached to the enclosure and positioned between the magnetic securement means on the enclosure and the ferromagnetic means on the cover, and which is sufficiently flexible to be capable of conforming to irregularities in the surface of the ferromagnetic means to thereby provide an electrical seal between the cover and the enclosure sufficient to prevent the passage of electromagnetic radiation therethrough.

In another embodiment, the electrical sealing means comprise a metal mesh associated with the enclosure and positioned between the magnetic securement means and the ferromagnetic means to provide an electrical seal with the ferromagnetic means on the cover. The metal mesh is capable of conforming to irregularities in the surface of the ferromagnetic means to provide an electrical seal between the cover and the enclosure sufficient to prevent the passage of electromagnetic radiation therethrough.

DETAILED DESCRIPTION OF THE INVENTION

Figure 1:
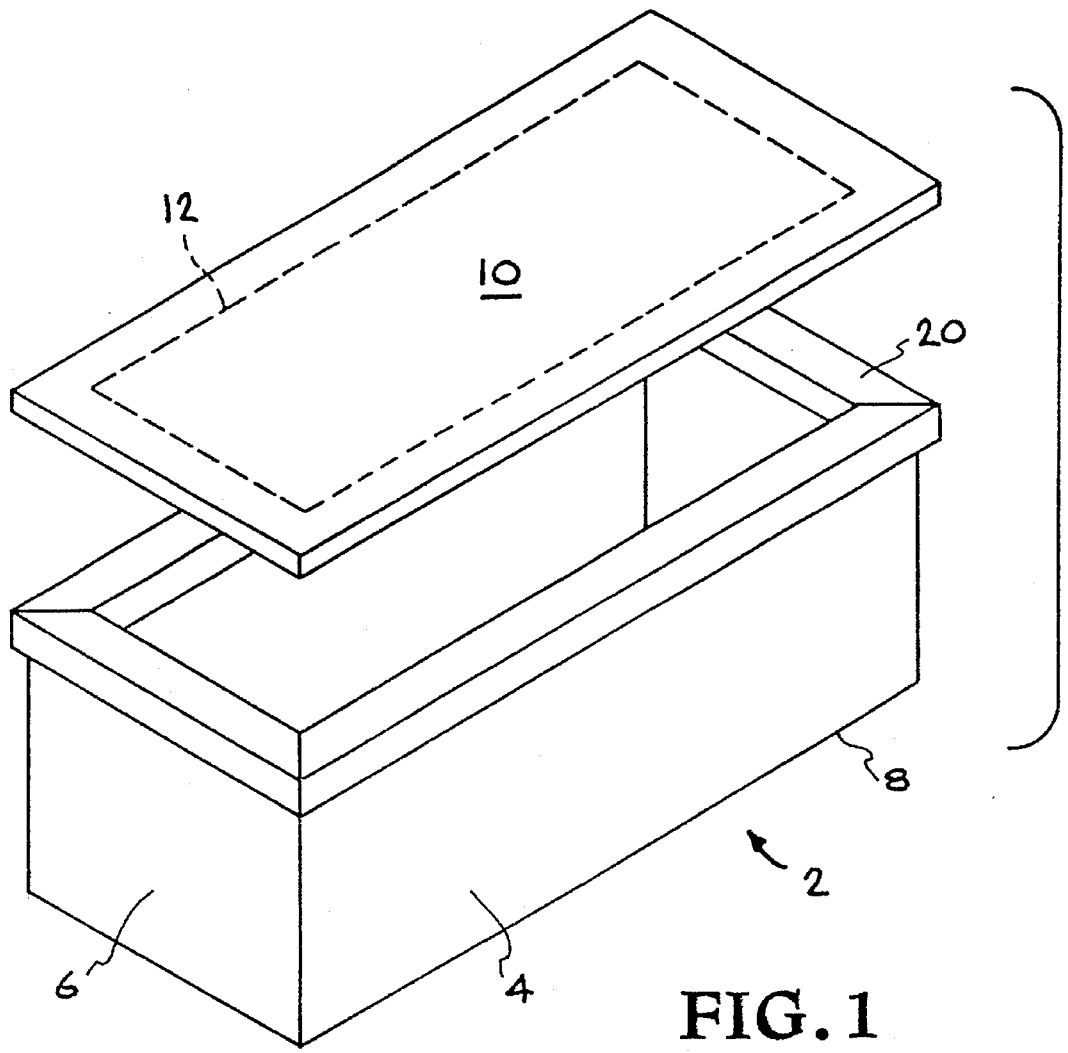
FIG. 1 is a partially exploded isometric view of the enclosure and the cover, showing the magnetic securement means and electrical sealing means of the invention located on the upper edge of the enclosure surrounding the open top.
Figure 2:
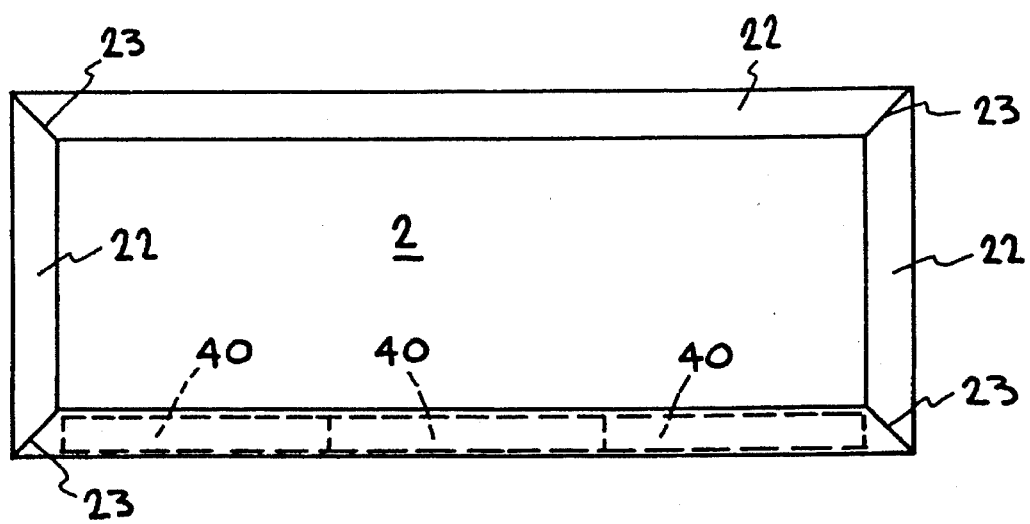
FIG. 2 is a top view of the magnetic securement means and electrical sealing means of the invention positioned on the upper edge of the enclosure.
Figure 3:
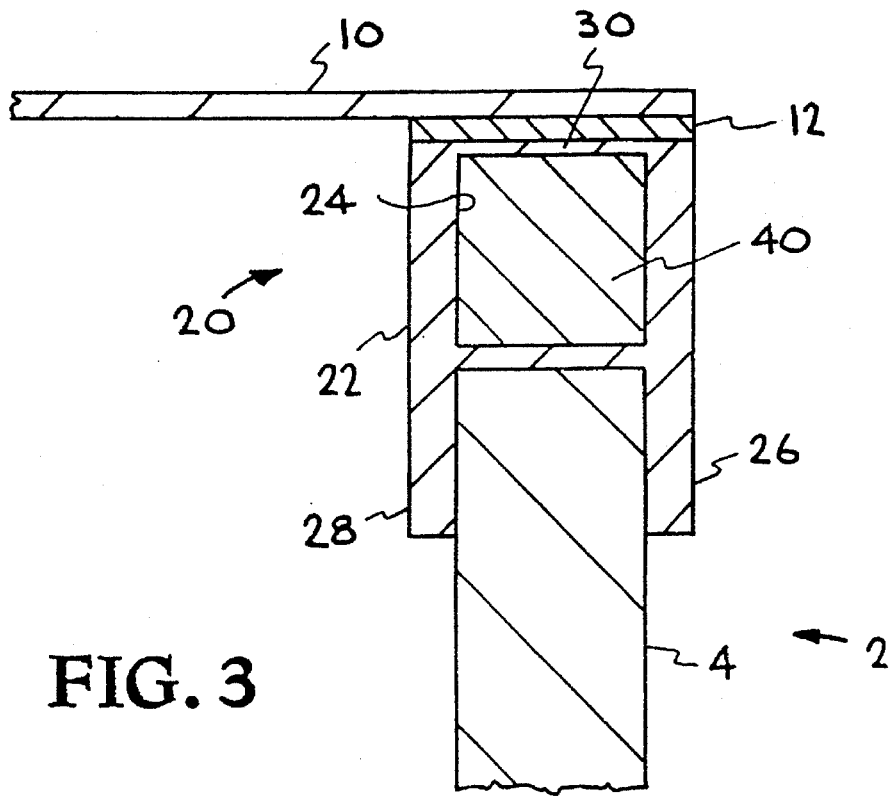
FIG. 3 is a fragmentary vertical cross sectional view of a portion of the enclosure with the magnetic securement means and electrical sealing means of FIG. 2 mounted thereon and showing the securement of the cover to the enclosure by the magnetic securement means and electrical sealing means.

Turning now to FIGS. 1–3, an electrically shielded enclosure 2 is shown, which in the illustrated embodiment is provided with sidewalls 4, end walls 6 and a bottom wall 8. Enclosure 2 houses electrical components (not shown) therein which may, for example, comprise a computer or the electrical components used in the generation of a laser beam. Enclosure 2 is formed of any metal or electrically conductive material capable of electrically shielding the electronic components within enclosure 2 to prevent either external electromagnetic interference (EMI) or radio interference (RFI) fields (collectively referred to herein as electromagnetic radiation) from entering enclosure 2, or internally generated electromagnetic radiation from escaping through the walls of enclosure 2.

A removable shielded cover 10 is shown in FIGS. 1 and 3. Cover 10 may be formed of any metal or other electrically conductive material capable of providing an electrical shield which will prevent electromagnetic radiation from either entering or leaving enclosure 2 through cover 10. As shown in FIG. 3, as well as by the dotted lines in FIG. 1, when cover 10 does not comprise a ferromagnetic material, a layer of ferromagnetic material 12, such as, for example, magnetic stainless steel, may be provided on the undersurface of cover 10 around the periphery of the undersurface of cover 10 which will be engaged by the magnetic securement means on enclosure 2, as will be described below.

Still referring to FIGS. 1–3, magnetic securement means, generally indicated at 20, are mounted on the top or end edges of sidewalls 6 and endwalls 8 of enclosure 2 around the periphery of the opening comprising the top of enclosure 2. Magnetic securement means 20, are positioned on enclosure 2 to face cover 10 to thereby secure cover 10 to enclosure 2, in accordance with the invention, in a manner which will provide an electrical seal between cover 10 and enclosure 2 to prevent the passage of electromagnetic radiation through the joint between cover 10 and enclosure 2. As shown in FIG. 3, magnetic securement means 20 comprises a metal extrusion 22, having a rectangular cross sectional shape with two legs. The closed rectangular portion 24 of extrusion 22 houses one or more channel magnets 40, as will be further discussed below.

Extrusion 22 is provided with generally parallel leg portions 26 and 28 which depend from rectangular portion 24 and are spaced apart a distance just slightly larger than the width of walls 4 and 6 of enclosure 2 to thereby straddle walls 4 and 6 to provide a snug fit therebetween, as shown in FIG. 3. Fasteners 50, such as screws, may be used to both secure extrusion 22, at leg 26, to walls 4 and 6, as well as to further provide electrical contact between enclosure 2 and extrusion 22. Extrusion 22 may be formed of any metallic material capable of cooperating with metal cover 10 and metal enclosure 2 in providing the desired electromagnetic shielding.

When portions of extrusion 22 are mounted on the end edges of sidewalls 6 and endwalls 8 of enclosure 2, via legs 26 and 28 of extrusion 22, as shown in FIG. 2, the intersecting corners of extrusion 22 can be mitered, as shown at 23, whereby the entire periphery of the opening to enclosure 2 is continuously provided with portions of extrusion 22.

As mentioned above, one or more channel magnets 40 are received within closed portion 24 of extrusion 22, as best seen in FIG. 3. Magnet(s) 40 may be loosely mounted in closed portion 24 or it may be potted with a suitable adhesive potting material, e.g., an epoxy adhesive or the like. Depending upon the length and configuration of each section of extrusion 22, one or more magnets 40 may be provided along each side of the opening to enclosure 2 on which extrusion 22 is mounted. Thus, for example, as shown in the dotted lines in FIG. 2, three channel magnets may be placed in a single strip of extrusion 22 mounted to one sidewall 6 of enclosure 2, either directly abutting one another, as shown in FIG. 2, or spaced a distance apart which is insufficient to prevent the entire ferromagnetic portion 12 of cover 10 from being uniformly held to extrusion 22 by the force of magnet(s) 40.

In the embodiment of FIG. 3, extrusion 22 is further provided with a flexible top metal portion 30 lying over magnet 40, which comprises the upper wall of box portion 24 of extrusion 22. Flexible metal portion 30 serves both to retain magnet(s) 40 in closed portion 24 of extrusion 22, as well as to provide an electrical sealing means which is clamped to ferromagnetic material 12, which is secured to the lower surface of cover 10. By making metal portion 30 sufficiently flexible so that it will continuously contact ferromagnetic material 12 around the entire periphery of the opening, no electromagnetic radiation can then penetrate through the joint between upper portion 30 on extrusion 22 (which is secured to enclosure 2) and ferromagnetic material 12 (which is secured to cover 10). While the flexibility of metal portion 30 may vary with the strength of magnet 40, with the needed magnetic force being inversely proportional to the flexibility of metal portion 30, generally the thickness of metal portion 30 will range from about 1.59 millimeters (mm), i.e. 1/16 inch, to 3.17 mm, i.e. 1/8 inch, for an average magnet strength of about 12 lbs per linear inch. This will ensure sufficient flexibility of metal portion 30 to provide the desired bond and electrical seal between the upper surface of metal portion 30 and the mating surface of ferromagnetic material 12.

Figure 4:
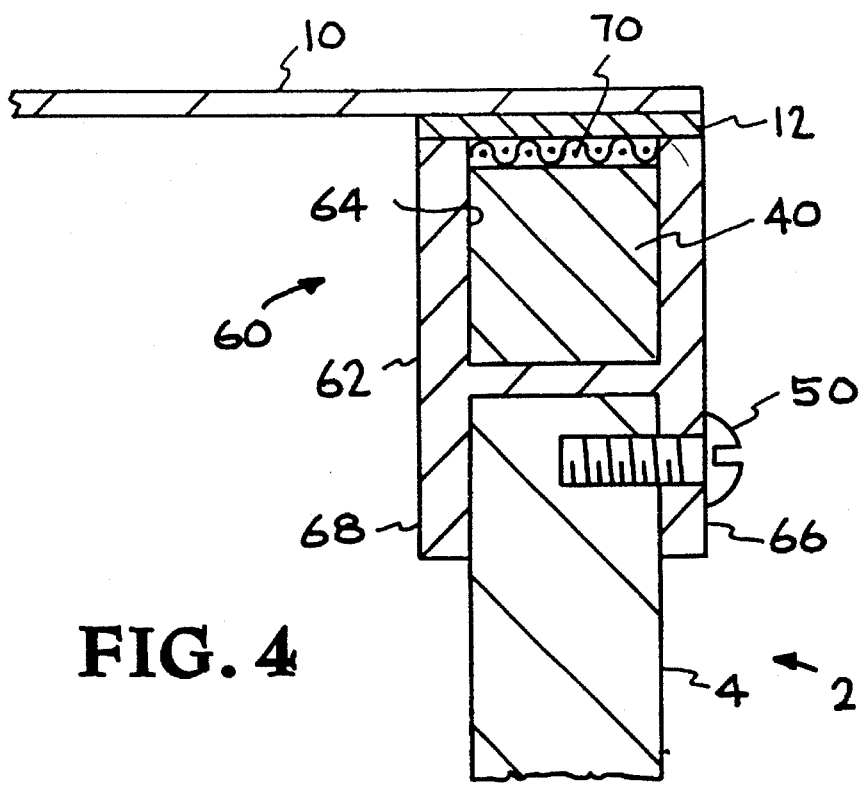
FIG. 4 is a fragmentary vertical cross sectional view of a portion of the enclosure and cover of FIG. 3 illustrating another embodiment of the magnetic securement means and electrical sealing means of the invention.

Turning now to FIG. 4, an alternate embodiment is shown wherein magnetic securement means 60 comprises a metal extrusion 62 wherein flexible metal portion 30 of the previous embodiment of FIGS. 1–3 (comprising the top surface of extrusion 22 of the previous embodiment) is eliminated. Magnet 40 is then mounted in a U-shaped open portion 64 of extrusion 62 having depending parallel leg portions 66 and 68 (which straddle walls 6 and 8 of enclosure 2 similarly to legs 26 and 28 of extrusion 22) to thereby electrically and mechanically secure extrusion 62 to sidewall 6 or endwall 8 of enclosure 2. As in the previous embodiment, fastener means 50 may be used to further mechanically and electrically secure extrusion 62 to sidewalls 6 and endwalls 8 of enclosure 2.

To provide the desired electrical seal, in accordance with the invention, between enclosure 2 and cover 10, compressible material 70, comprising wire mesh or braid, or other yieldable electrically conductive material, is mounted in U-shaped opening 64 above magnet 40 to contact ferromagnetic material 12 on shielded cover 10, when cover 10 is placed on enclosure 2. Thus, when cover 10 is placed over enclosure 2, the magnetic force of magnet(s) 40 will clamp ferromagnetic material 12 on cover 10 to magnet(s) 40, causing compressible material 70 to be squeezed between magnet(s) 40 and ferromagnetic material 12 to thereby provide the desired electrical seal which will not permit the passage therethrough of electromagnetic radiation either into or out of enclosure 2.

Thus, the magnetically actuated electrical seal of the invention permits rapid and easy ingress to an electrically shielded enclosure housing electrical components, in a manner which, while providing easy access, prevents electromagnetic radiation from passing through the electrical seal to either enter or exit the enclosure when the cover is mounted to the enclosure and secured thereto by the magnetic securement means carried in the extrusion mounted around the entire periphery of the opening to the enclosure.

While a specific embodiment of the magnetically actuated electrical seal of the invention has been illustrated and described, modifications and changes of the apparatus, parameters, materials, etc. will become apparent to those skilled in the art, and it is intended to cover in the appended claims all such modifications and changes which come within the scope of the invention.

What is claimed is:

1. An electrically shielded enclosure with magnetically retained removable cover comprising:

a) an enclosure of electrically conductive material having a bottom and an enclosing side wall forming an opening;

b) a magnetic securement means including
      a body of electrically conductive material, said body having legs for mechanically and electrically attaching said securement means to said side wall, said body having a flexible top portion between said legs, and
      a magnet disposed between the top of said side wall and said flexible top portion; and c) a cover of electrically conductive material for covering the opening; said cover having ferromagnetic means which is disposed over said flexible top portion of said magnetic securement means when said cover is mounted on said enclosure, the magnetic attraction between said magnet and said ferromagnetic means securing said ferromagnetic means against said flexible top portion to provide an electrical connection and an electromagnetic radiation seal between said cover and said enclosure.

2. The electrically shielded enclosure of claim 1, wherein said body of said magnetic securement means is manufactured by extrusion.

3. The electrically shielded enclosure of claim 1 wherein said ferromagnetic means are provided on the surface of said cover facing said flexible top portion of said magnetic securement means.

4. The electrically shielded enclosure of claim 3 wherein said flexible top portion of said magnetic securement means is sufficiently flexible to be capable of conforming to irregularities in the surface of the ferromagnetic means to thereby provide an electrical seal between said cover and said enclosure sufficient to prevent the passage of electromagnetic radiation therethrough.

* * * * *